United States Patent [19]
Brown

[11] Patent Number: 5,608,247
[45] Date of Patent: Mar. 4, 1997

[54] STORAGE CAPACITOR STRUCTURES USING CVD TIN ON HEMISPHERICAL GRAIN SILICON

[75] Inventor: Kris K. Brown, Garden City, Id.

[73] Assignee: Micron Technology Inc., Boise, Id.

[21] Appl. No.: 440,573

[22] Filed: May 15, 1995

Related U.S. Application Data

[62] Division of Ser. No. 259,766, Jun. 14, 1994, Pat. No. 5,418,180.

[51] Int. Cl.⁶ .......................... H01L 27/108; H01L 29/76; H01L 29/94; H01L 31/119
[52] U.S. Cl. ........................ 257/306; 257/309; 257/310
[58] Field of Search ......................... 257/309, 310

[56] References Cited

U.S. PATENT DOCUMENTS

| | | | |
|---|---|---|---|
| 5,110,752 | 5/1992 | Lu | 257/309 |
| 5,111,355 | 5/1992 | Anand et al. | 361/313 |
| 5,312,768 | 5/1994 | Gonzalez | 437/40 |
| 5,418,180 | 5/1995 | Brown | 437/60 |

FOREIGN PATENT DOCUMENTS

| | | | |
|---|---|---|---|
| 2-210790 | 8/1990 | Japan . | |
| 2-300472 | 11/1990 | Japan . | |
| 4-43674 | 2/1992 | Japan | 257/309 |
| 4-93067 | 3/1992 | Japan | 257/310 |
| 4-171975 | 6/1992 | Japan . | |
| 5-21744 | 1/1993 | Japan | 257/310 |
| 5-335483 | 12/1993 | Japan | 257/310 |

*Primary Examiner*—Mahshid D. Saadat
*Assistant Examiner*—Jhihan Clark

[57] ABSTRACT

An embodiment of the present invention depicts a storage capacitor comprising: a bottom plate structure having a hemispherical grain silicon surface; a titanium nitride layer adjacent and coextensive the hemispherical grain silicon; an insulating layer adjacent and coextensive the titanium nitride layer; and a top plate structure comprising conductively doped polysilicon layer superjacent and coextensive the insulating layer.

7 Claims, 9 Drawing Sheets

STORAGE CAPACITOR STRUCTURES USING CVD TIN ON HEMISPHERICAL GRAIN SILICON

CROSS REFERENCE TO A RELATED APPLICATION

This is a divisional to U.S. patent application Ser. No. 08/259,766, filed Jun. 14, 1994 U.S. Pat. No. 5,418,180. This application is related to a U.S. patent application Ser. No. 08/106,503, filed Aug. 13, 1993.

FIELD OF THE INVENTION

This invention relates to semiconductor circuit memory storage devices and more particularly to three-dimensional stacked capacitor structures and processes to create same that may be used in such storage devices as high-density dynamic random access memories (DRAMs).

BACKGROUND OF THE INVENTION

In dynamic semiconductor memory storage devices it is essential that storage node capacitor cell plates be large enough to retain an adequate charge (or capacitance) in spite of parasitic capacitances and noise that may be present during circuit operation. As is the case for most semiconductor integrated circuitry, circuit density is continuing to increase at a fairly constant rate. The issue of maintaining storage node capacitance is particularly important as the density of DRAM arrays continues to increase for future generations of memory devices.

The ability to densely pack storage cells while maintaining required capacitance levels is a crucial requirement of semiconductor manufacturing technologies if future generations of expanded memory array devices are to be successfully manufactured.

One method of maintaining, as well as increasing, storage node size in densely packed memory devices is through the use of "stacked storage cell" design. With this technology, two or more layers of a conductive material such as polycrystalline silicon (polysilicon or poly) are deposited over an access device on a silicon wafer, with dielectric layers sandwiched between each poly layer. A cell constructed in this manner is known as a stacked capacitor cell (STC). Such a cell utilizes the space over the access device for capacitor plates, has a low soft error rate (SER) and may be used in conjunction with inter-plate insulative layers having a high dielectric constant.

However, it is difficult to obtain sufficient storage capacitance with a conventional STC capacitor as the storage electrode area is confined within the limits of its own cell area. Also, maintaining good dielectric breakdown characteristics between poly layers in the STC capacitor becomes a major concern once insulator thickness is appropriately scaled.

U.S. Pat. No. 5,162,248, having the same assignee as does the present invention, is a related process to form a container cell. All publications cited herein are hereby incorporated by reference.

SUMMARY OF THE INVENTION

A general embodiment of the present invention is a storage capacitor comprising:

a bottom plate structure having a hemispherical grain silicon surface;

a titanium nitride layer adjacent and coextensive the hemispherical grain silicon;

an insulating layer adjacent and coextensive the titanium nitride layer; and a top plate structure comprising conductively doped polysilicon layer superjacent and coextensive the insulating layer.

The capacitor is developed by a process for fabricating a capacitor on a supporting substrate, by the steps of:

forming a bottom capacitor plate from hemispherical grain silicon;

forming a titanium nitride layer adjacent and coextensive the hemispherical grain silicon;

forming an insulating layer adjacent and coextensive the titanium nitride layer; and forming a conductive layer superjacent and coextensive the insulating layer.

An alternate embodiment of the present invention develops a process for fabricating a conductive container structure on a supporting substrate, by the steps of:

forming a planarized insulating layer;

forming an opening into the planarized layer;

forming multiple layers of silicon into the opening, wherein the first and last layers formed comprise amorphous silicon;

forming multiple silicon interfacing layers at the silicon grain boundaries between each layer;

separating the multiple layers of silicon into individual container structures having inner and outer surfaces and thereby exposing the planarized insulating layer;

partially removing the planarized insulating layer thereby exposing the outer surface of the container structures;

converting the exposed inner and outer surfaces of amorphous silicon into hemispherical grain silicon by subjecting the inner and outer surfaces to a high vacuum anneal, the hemispherical grain silicon serves as a bottom conductive capacitor plate;

forming a titanium nitride layer adjacent and coextensive the hemispherical grain silicon;

forming an insulating layer adjacent and coextensive the titanium nitride layer; and forming a top conductive capacitor plate superjacent and coextensive the insulating layer.

DETAILED DESCRIPTION OF THE PRESENT INVENTION

The present invention is directed to maximizing storage cell surface area by providing uniform, storage cell structures across a given supporting substrate, in a high density/high volume DRAM fabrication process. The following process steps described below serve as an example as well as a preferred method of implementing the present invention. However, the example is not intended to limit a broad scope of the invention.

Figure 1:
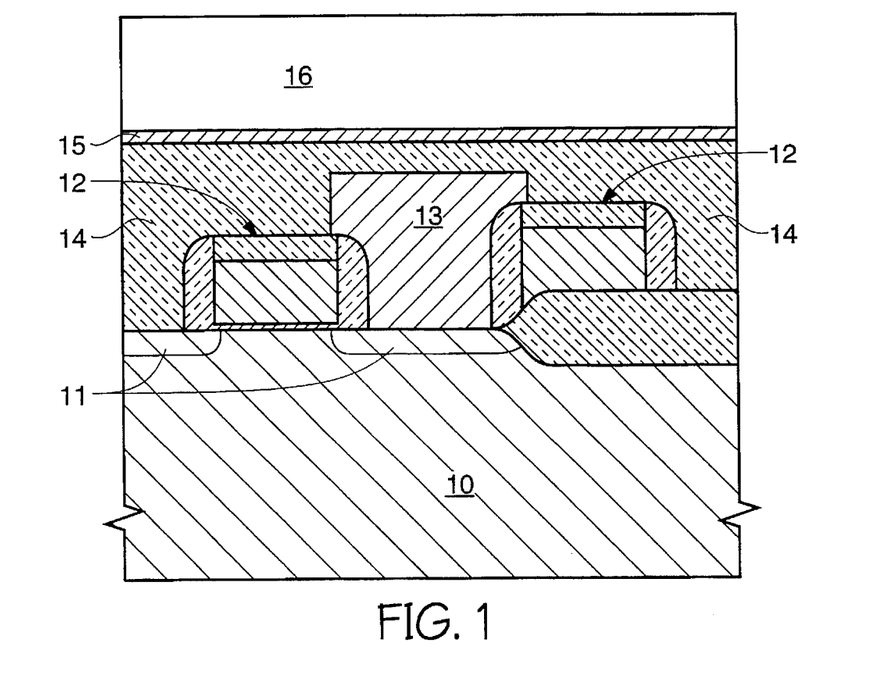
FIG. 1 is a composite cross-sectional view of an in-process wafer portion depicting the beginning steps of an embodiment of the present invention, whereby a polysilicon plug has been formed between two word lines, followed by a planarized layer of tetra-ethyl-ortho-silicate (TEOS) oxide, deposition of a nitride film and a planarized layer of borophosphosilicate glass (BPSG)

As shown in FIG. 1, a supporting substrate, such as a silicon wafer, is prepared using conventional process steps to form a conductively doped poly plug 13 residing between neighboring word lines 12 and making contact to diffusion region 11 of substrate 10. Planarized oxide 14 insulates word lines 12 and poly plug 13. On top of planarized oxide 14 is formed a thin film of nitride 15. This nitride 15 is optional as will be discussed further in the process. Then nitride 15 15, is blanketed with another planarized oxide layer 16. The wafer has been processed up to the point of processing an array of storage cell capacitors. Capacitor cell fabrication will now follow.

The storage capacitor of each memory cell will make contact to the underlying diffusion region 11 via poly plug 13. Each underlying diffusion region 11 will have two storage node connections isolated from a single digit line contact by access transistors formed by poly word lines 12 crossing the active area. Normally each diffusion region 11 within the array is isolated from one another by a thick field oxide. Diffusion regions 11 and the poly word lines 12 (control gates) form active field effect transistors (FETS serving as access transistors to each individual capacitor) that can be doped as NMOS or PMOS type FETs depending on the desired use.

Figure 2A:
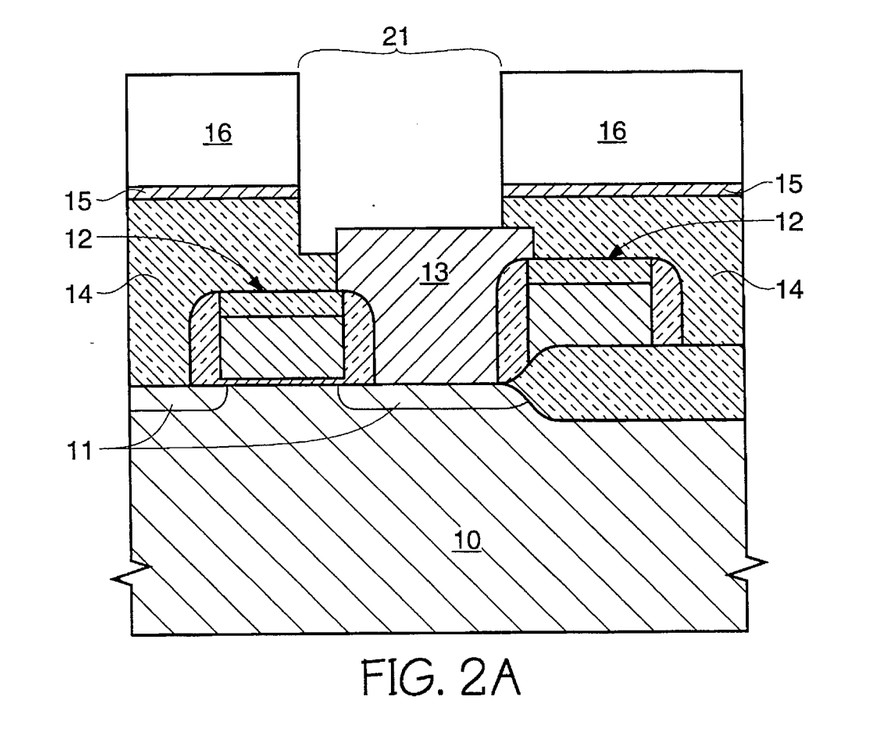
FIG. 2a is a cross-sectional view of the in-process wafer portion of FIG. 1 after a contact opening exposing the poly plug.
Figure 2B:
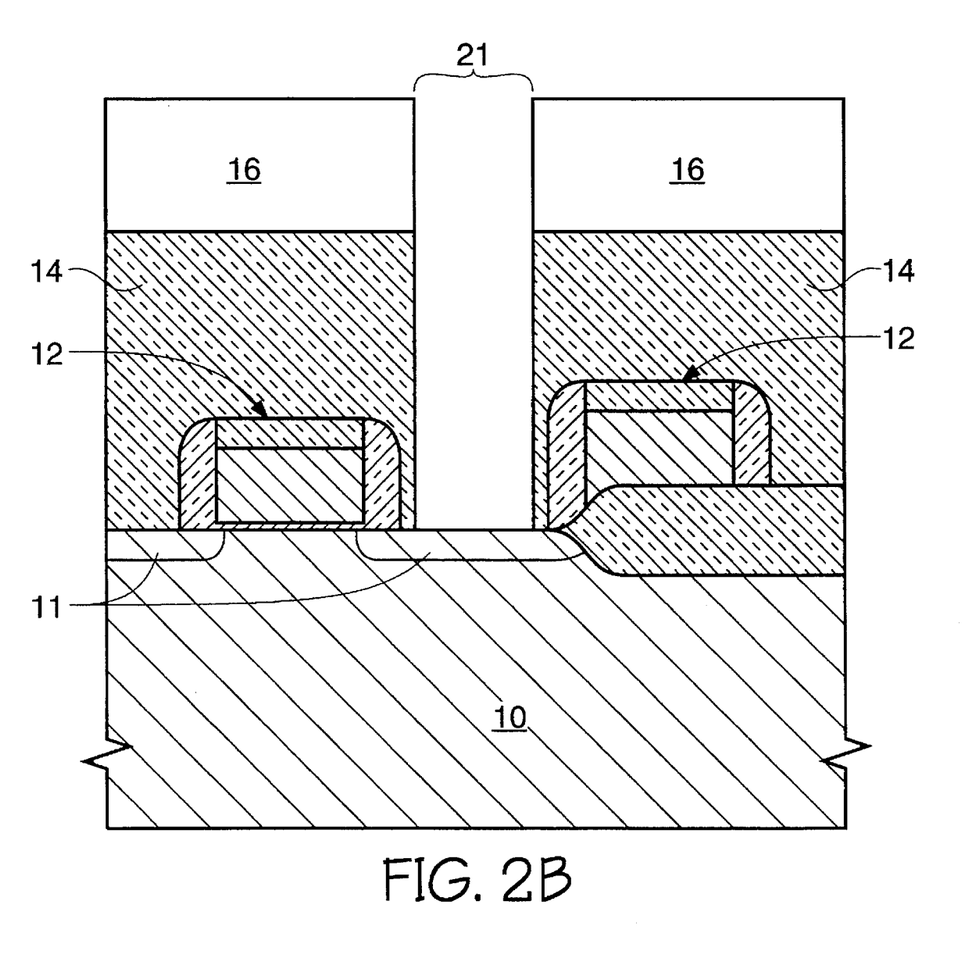
FIG. 2b is a cross-sectional view of an in-process wafer portion similar to that of FIG. 1 after a contact opening exposing the underlying silicon substrate (no poly plug present)

Referring now to FIG. 2a, the thickness of planarized oxide layer 16 depends on the height that is desired for the poly container structure yet to be formed. The height of the resulting poly structure will be one of the factors in determining the resulting capacitor plate surface area desired. A contact opening 21 is etched into oxide 16, nitride 15 and oxide 14, thereby allowing access to the underlying poly plug 13. Contact opening 21 not only allows access to the underlying topography but also provides a form at contact opening 21 for a subsequently placed layer of conductively doped thin poly. (Alternatively, the contact opening may be etched down to diffusion area 11, as a poly plug need not be present, as shown in FIG. 2b.)

Figure 3:
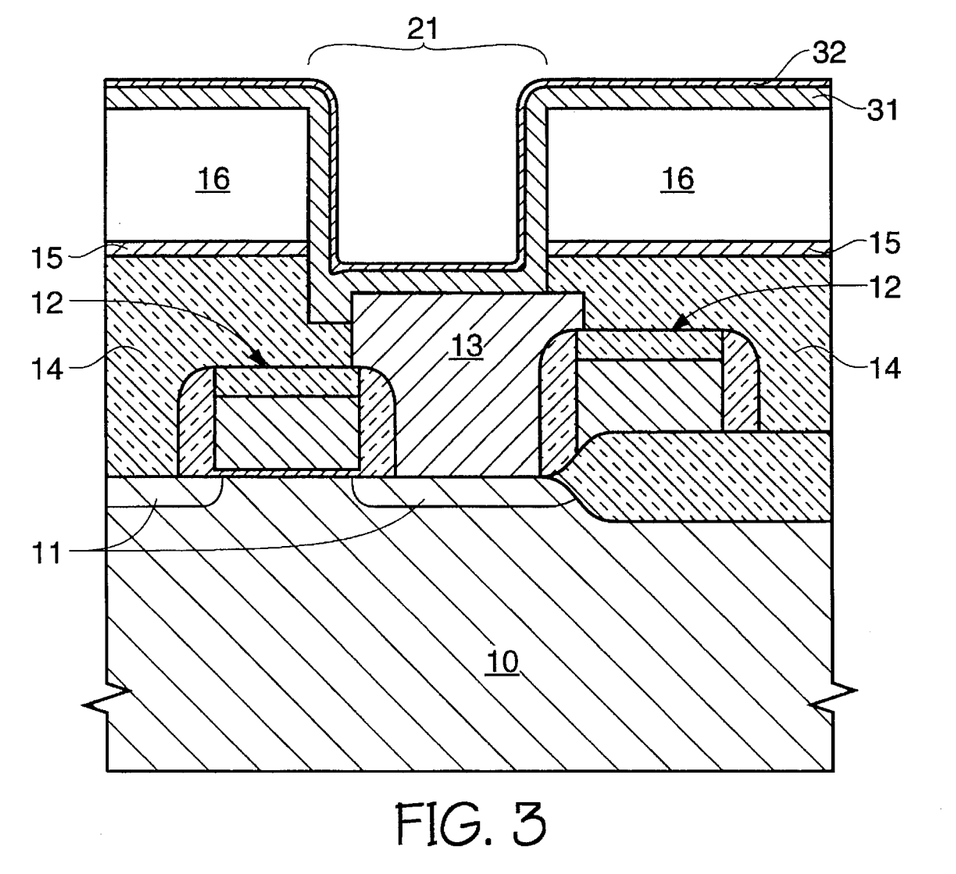
FIG. 3 is a cross-sectional view of the in-process wafer portion of FIG. 2a after a deposition of a first layer of amorphous silicon followed by a controlled exposure to oxygen.
Figure 4:
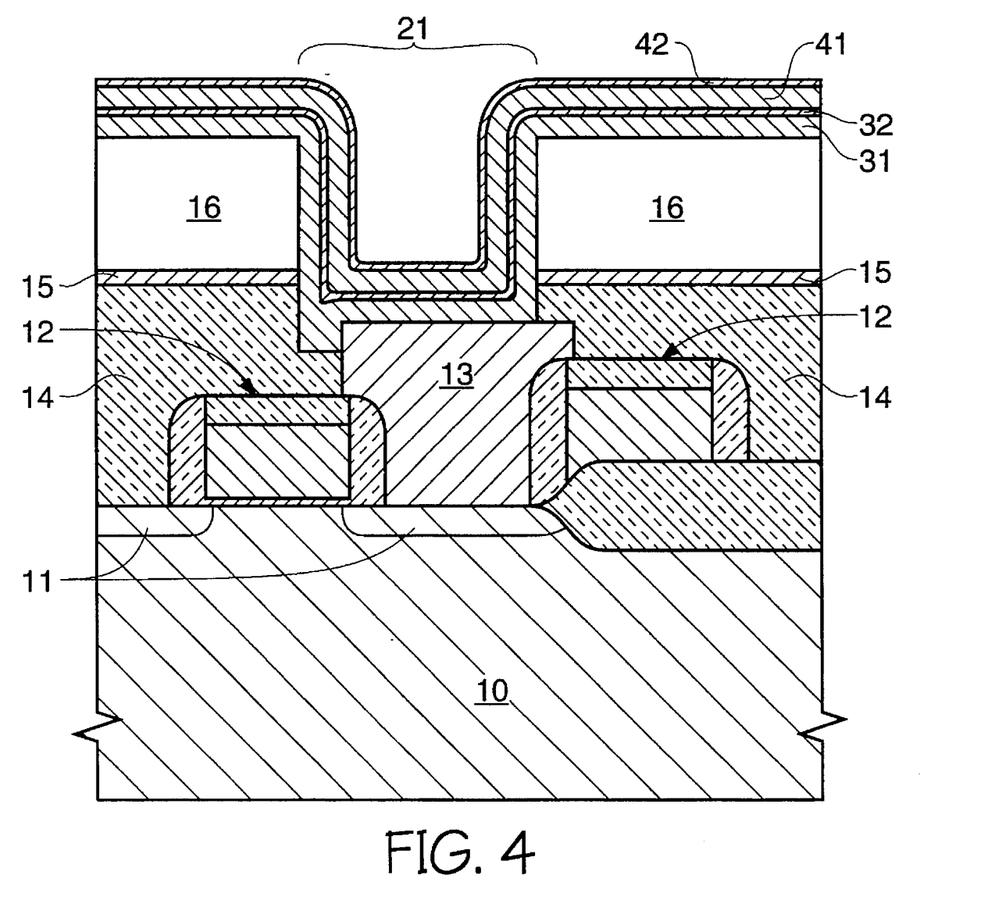
FIG. 4 is a cross-sectional view of the in-process wafer portion of FIG. 3 after a deposition of a second layer of amorphous silicon followed by a controlled exposure to oxygen.
Figure 5:
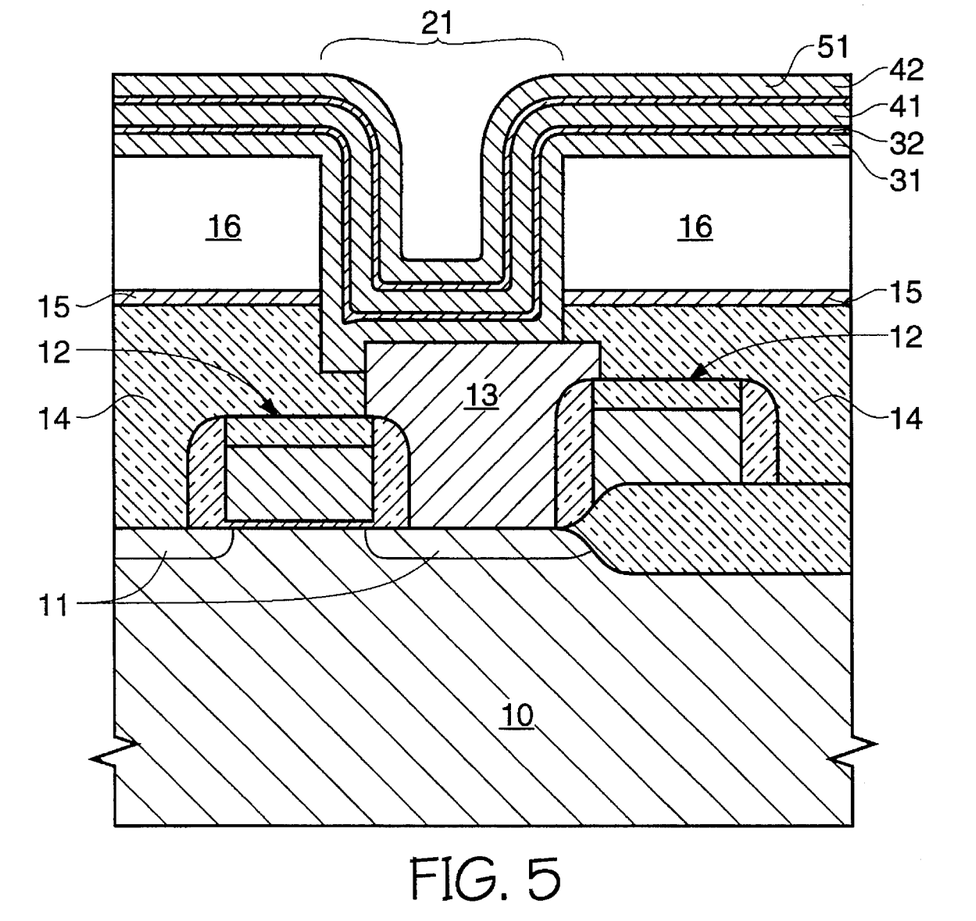
FIG. 5 is a cross-sectional view of the in-process wafer portion of FIG. 4 after a deposition of a third layer of amorphous silicon followed by a controlled exposure to oxygen.

Referring now to FIG. 3, a thin amorphous silicon layer 31 (approximately 400 Å) is now formed (i.e. deposited) either undoped or in-situ doped by a p-type or n-type dopant, such as arsenic, phosphorous or boron. At the end of this step, the grain boundaries at the interface are "frozen" or "locked" in by either an introduction of an impurity, such as oxygen, carbon, or $N_2O$, etc., or by exposing the silicon layer to an oxidizing ambient ($O_2$ or $H_2O$) or a nitridizing ambient ($N_2$ or $NH_3$). When the silicon grains at this interface are "locked" by a very slight oxidation, it is critical that this oxide film (grown or deposited) not be of too thick in that it will completely block conduction and out diffusion of dopants if the first layer is undoped (3–12 Å of $SiO_2$ is preferred). It is also preferred that the silicon films be deposited insitu in an Rapid Thermal Chemical Vapor Deposition (RTCVD) based system, but an alternative manufacturing method would be to deposit the initial amorphous silicon layer in a Low Pressure Chemical Vapor Deposition (LPCVD) reactor either bleed in dilute $O_2$ or remove the wafers, thus exposing the silicon to the atmosphere and either directly reinsert the wafers or wet process the wafers using a dilute HF dip before re-inserting the wafers. These steps would thereby produce a native oxide 32 on the top of the first deposited layer of silicon. Next, as seen in FIG. 4 deposit an insitu doped layer of silicon 41 (note: This second or center layer may be the sole source of dopant if the first and third layers are deposited undoped). Next bleed in $O_2$ or use the other methods (discussed above) for interface formation layer 42 and then deposit the third silicon layer 51, as seen in FIG. 5. The third silicon layer could be hemispherical grain silicon deposited by methods know to those skilled in the art, such as the method described in an article entitled "A New Cylindrical Capacitor Using Hemispherical Grained Si (HSG-Si) for 256 Mb DRAMs," by Watanabe et al., 1992 IEDM, pp. 259–262, herein incorporated by reference.

Figure 6:
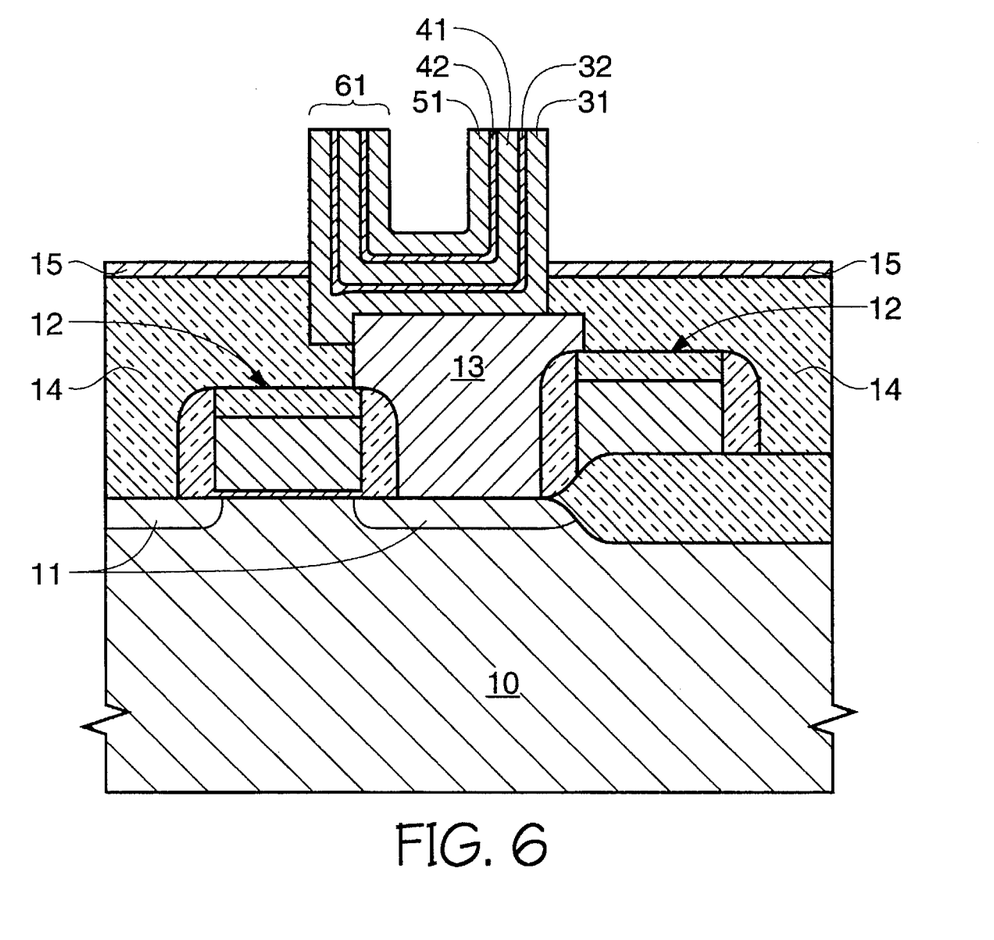
FIG. 6 is a cross-sectional view of the in-process wafer portion of FIG. 5 after performing chemical mechanical polishing to form individual storage nodes followed by an etch to remove the BPSG.

Referring now to FIG. 6, a stacked structure 61 of amorphous silicon results from being planarized (planarization by chemical mechanical polishing, or resist coat, $O_2$ plasma and poly etch) until oxide 16 is exposed which also separates each neighboring capacitor storage node plate from one another across the die. Next, a wet oxide etch back is performed to remove oxide 16 (seen in FIG. 5) with this etch stopping on nitride layer 15. As mentioned previously, nitride layer 15 is optional but also preferred in that it provides a definite etch stopping target for the wet oxide etch. However, nitride layer 15 need not be used at all as one can rely on the different etching rates between layers 16 and 14 if different materials are used. For example, in the preferred embodiment, layer 14 is TEOS and layer 16 is borophosphosilicate glass (BPSG). Because, BPSG has a much higher etch rate compared to TEOS, the BPSG can safely be completely removed while still guaranteeing a sufficient thickness of TEOS to remain and provide adequate isolation to the underlying word lines 12.

Figure 7A:
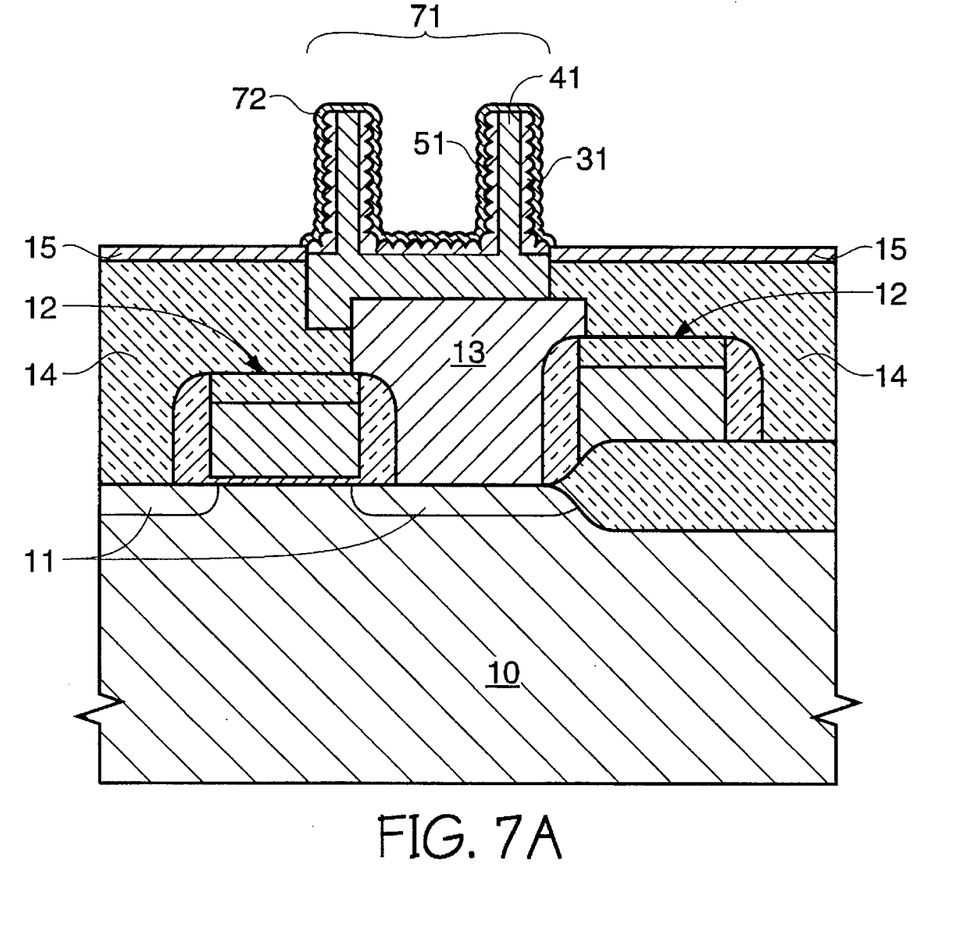
FIG. 7a is a cross-sectional view of the in-process wafer portion of FIG. 6 following formation of hemispherical grain silicon resulting from a high vacuum anneal.

Referring now to FIG. 7a, the planarized amorphous structure 61 is subjected to a high vacuum anneal to form hemispherical grain (HSG) silicon on both the inside and outside of structure 61. Rapid Thermal Processing (RTP) assisted heating may be used at high vacuum anneal to further promote HSG formation. The result is the HSG silicon structure 71, which in this application, forms a capacitor storage node plate container 71. The amorphous silicon is converted into hemispherical grain silicon by subjecting the structure to rapid thermal processing or a high vacuum anneal, whereby the silicon atoms from the first and last silicon layers are consumed while the silicon atoms of any inner silicon layer remain intact and do not penetrate the silicon interfacing layers. Capacitor storage node plate container 71 is enhanced by forming a layer of titanium nitride 72 over all the exposed hemispherical grain silicon (It is preferred that titanium nitride layer 72 is formed by chemical vapor deposition). The presence of titanium nitride 72 will eliminate the formation of any depletion region that tends to form under the subsequently formed cell dielectric when hemispherical grain silicon is present.

Figure 7B:
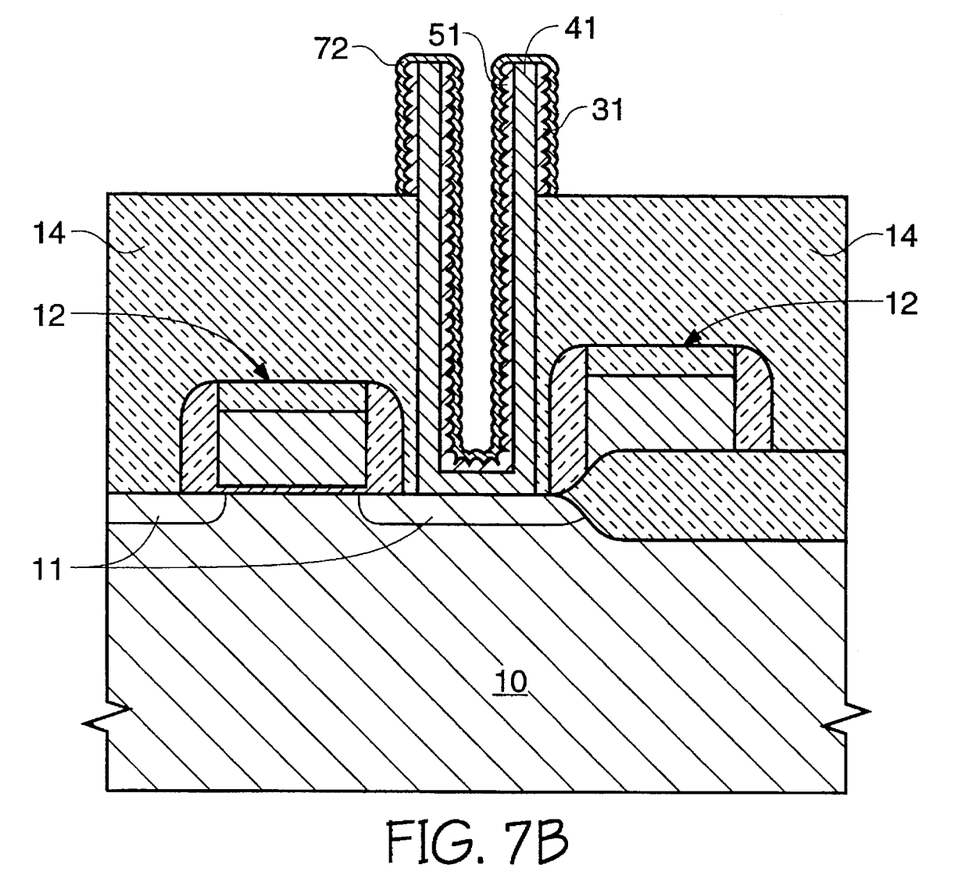
FIG. 7b is a cross-sectional view of an alternate embodiment of the in-process wafer portion similar to that of FIG. 6 following formation of hemispherical grain silicon resulting from a high vacuum anneal.

Alternately, FIG. 7b shows a completed capacitor storage node plate container 71 that makes direct contact to diffusion area 11 and thus not using a poly plug interconnect. As described in FIG. 7a, capacitor storage node plate container 71 is enhanced by forming a layer of titanium nitride 72 over all the exposed hemispherical grain silicon.

Figure 8:
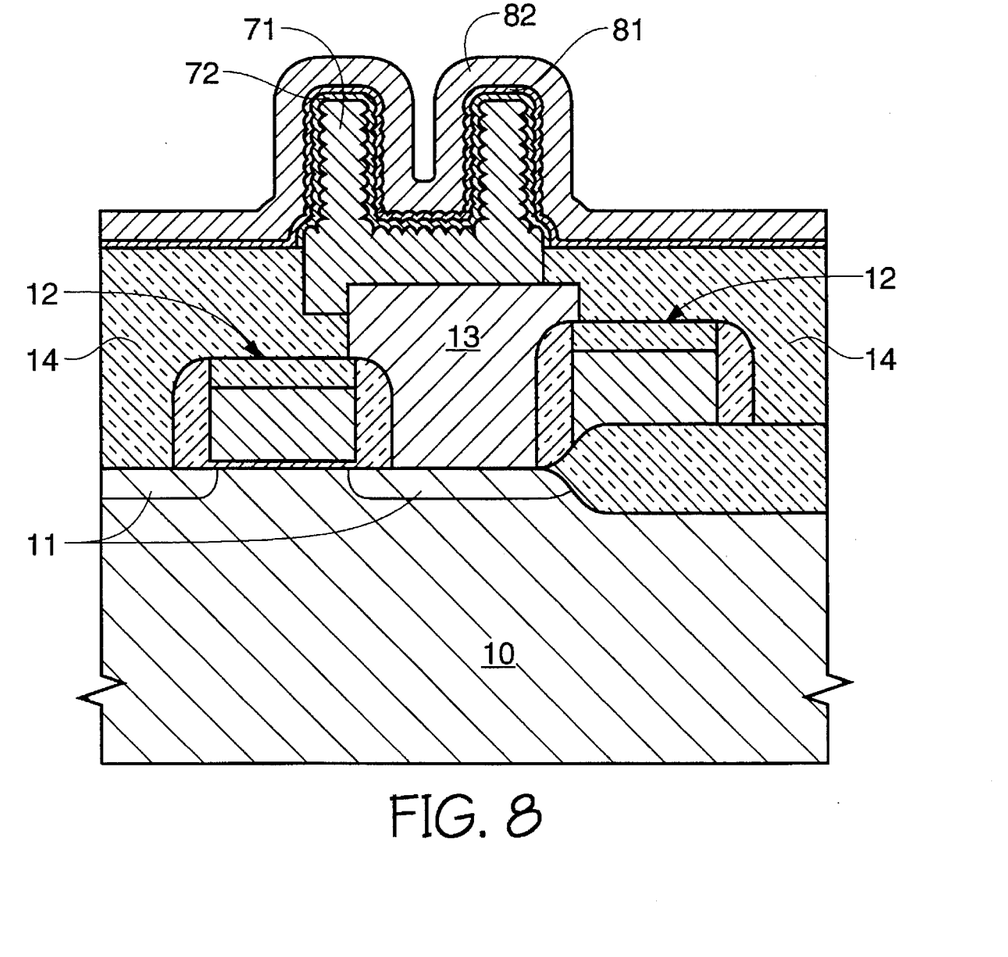
FIG. 8 is a cross-sectional view of the in-process wafer portion FIG. 7a following the formation of conformal cell dielectric and polysilicon, respectively.

Referring now to FIG. 8, container 71 is coated with a capacitor cell dielectric 81 (nitride is preferred). Finally, a doped conformal poly layer 82 blankets cell dielectric 81 and serves as a common capacitor cell plate to an entire array of containers 71. From this point on the wafer is completed using conventional fabrication process steps.

An important concept of the present invention is the use of titanium nitride to coat hemispherical grain silicon which together form a storage node cell plate. This concept can be used in any capacitor process and is not limited to the capacitor process described above.

It is to be understood that although the present invention has been described with reference to a preferred embodiment, various modifications, known to those skilled in the art, may be made to the structures and process steps presented herein without departing from the invention as recited in the several claims appended hereto.

I claim:

1. A semiconductor device having a storage capacitor, said storage capacitor comprising:

a bottom plate structure having hemispherical grain silicon surface;

a conformal titanium nitride layer adjacent said hemispherical grain silicon surface;

an insulating layer adjacent said titanium nitride layer; and a top plate structure comprising conductively doped polysilicon over said insulating layer.

2. The semiconductor device as recited in claim 1, wherein said insulating layer comprises nitride.

3. A storage capacitor in a semiconductor device, said capacitor comprising:

a bottom plate structure having hemispherical grain silicon surface;

a conformal titanium nitride layer disposed on said hemispherical grain silicon surface;

an insulating layer disposed on said titanium nitride layer; and a top plate structure comprising conductively doped polysilicon disposed on said insulating layer.

4. The storage capacitor as recited in claim 3, said insulating layer comprises nitride.

5. A dynamic random access memory device having a storage capacitor, said capacitor comprising:

a bottom plate structure having a hemispherical grain silicon surface;

a conformal titanium nitride layer formed on said hemispherical grain silicon surface;

an insulating layer formed on said titanium nitride layer; and a top plate structure comprising a conductively doped polysilicon layer formed over said insulating layer.

6. The dynamic random access memory device as recited in claim 5, wherein said insulating layer comprises nitride.

7. A capacitor plate in a semiconductor device, said capacitor plate comprising:

a hemispherical grain silicon surface; and a conformal titanium nitride layer deposited on said hemispherical grain silicon surface.

* * * * *